(12) United States Patent
Ju et al.

(10) Patent No.: US 6,492,830 B1
(45) Date of Patent: Dec. 10, 2002

(54) METHOD AND CIRCUIT FOR MEASURING CHARGE DUMP OF AN INDIVIDUAL TRANSISTOR IN AN SOI DEVICE

(75) Inventors: Dong-Hyuk Ju, Cupertino, CA (US); William G. En, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 94 days.

(21) Appl. No.: 09/845,860

(22) Filed: Apr. 30, 2001

(51) Int. Cl.[7] ................................................ G01R 31/02

(52) U.S. Cl. ...................... 324/765; 324/158.1; 324/769

(58) Field of Search .............................. 324/765, 158.1, 324/763, 769, 72.5, 731, 754; 714/719, 724

(56) References Cited

U.S. PATENT DOCUMENTS 4,626,713 A * 12/1986 Lee .............................. 307/548
5,243,233 A * 9/1993 Cliff ......................... 324/158.1

* cited by examiner

Primary Examiner—Michael Sherry
Assistant Examiner—Jimmy Nguyen
(74) Attorney, Agent, or Firm—Renner, Otto, Boisselle & Sklar

(57) ABSTRACT

According to the invention, a method and circuit for measuring a transient of a MOFSET device under measurement of an SOI is provided. The device under measurement is connected from its drain to a measuring circuit having a trip point switching circuit. A supply voltage is applied to the drain through a capacitor connected to ground. When a high to low voltage pulse is applied to the source of the device, the threshold trip point can be determined whereby the dump charge through the transistor device can be determined.

18 Claims, 5 Drawing Sheets

METHOD AND CIRCUIT FOR MEASURING CHARGE DUMP OF AN INDIVIDUAL TRANSISTOR IN AN SOI DEVICE

TECHNICAL FIELD

The present invention relates generally to methods of and circuits for measuring a semiconductor-on-insulator (SOI) device transient and more particularly to methods and circuits for measuring the charge dump of an individual transistor in an SOI device.

BACKGROUND ART

Traditional semiconductor-on-insulator (SOI) integrated circuits typically have a silicon substrate with a buried oxide (BOX) layer disposed thereon. An active silicon layer is disposed on the opposite side of the BOX layer from the silicon substrate. Within the active silicon layer, active devices, such as transistors, are formed in active regions. The size and placement of the active regions are defined by shallow trench isolation (STI) regions. As a result of this arrangement, the active devices are isolated from the silicon substrate by the BOX layer. In addition, a body region of each SOI transistor does not have body contacts and is therefore floating.

Such SOI structures offer potential advantages over bulk chips for the fabrication of high performance integrated circuits for digital circuitry. Such digital circuitry is typically made from partially-depleted metal oxide semiconductor field effect transistors (MOSFETs). These SOI structures provide a significant gain in performance by having lower parasitic capacitance (due to the insulator layer) and increased drain current due to the floating body charging effects. These performance gains result from: a) no connection being made to the channel region, and b) charging of the floating body providing access toward a majority of carriers which dynamically lowers the threshold voltage and increased drain current. Devices, such as metal oxide silicon field effect transistors (MOSFET), have a number of advantages when formed on SOI wafers versus bulk silicon MOS transistors. These advantages include: reduced source/drain capacitance that results in improved speed performance at higher-operating frequencies; reduced $N^+$ to $P^+$ spacing and thus higher packing density due to ease of isolation; absence of latch-up; lower voltage applications; and higher soft error upset immunity (i.e., the immunity to the effects of alpha particle strikes).

Although there are significant advantages associated with SOI technology, there are some disadvantages as well. For example, there is an inability to reliably measure the SOI transient of a single MOSFET on an SOI substrate so as to better control the performance of a typical million plus (1,000,000+) transistor microprocessor.

In view of the aforementioned disadvantages, there is a need for a method and circuit for measuring the SOI transient of a single MOSFET in an SOI device.

SUMMARY OF THE INVENTION

According to the invention, a method is disclosed for measuring a charge dump current of a transistor device. The transistor device, typically a MOSFET on an SOI has a source, a drain, and a gate. The method comprises the steps of a) connecting a measuring circuit to the drain, the measuring circuit having a trip-point switching circuit with its trip point set to an initial trip point voltage that should not cause the switching circuit to trip; b) charging the drain to a supply voltage; c) applying a high-to-low voltage pulse to the source; d) detecting whether or not the trip-point switching circuit has tripped; e) when the switching circuit has not tripped, adjusting the trip point Voltage in increments and repeating steps b, c and d until a threshold trip point is reached where the trip-point switching circuit does trip; and f) recording the threshold trip point whereby the dump charge through the transistor device can be determined.

According to the invention, the method further includes the steps of: h) determining a first charge at the drain at the threshold trip voltage; i) determining a second charge at the drain at the supply voltage; and j) subtracting the first charge from the second charge to determine the total dump charge from the drain to the source.

Further according to the invention, the method includes the step of charging drain to the supply voltage by charging a capacitor connected to the drain and to ground to the supply voltage with a switchable connection.

According to the invention, a system for measuring the charge dump current of a transistor device on an SOI is disclosed. The device has a source, a drain, and a gate all formed on a substrate. The system has a measuring circuit connected to the drain. The measuring circuit includes a capacitor connected between the drain and ground, a switchable connection to apply a supply voltage to the capacitor, and a trip-point switching circuit connected to the drain. Circuit means are provided for setting the trip point of the trip-point switching circuit to an initial trip point voltage that should not cause the switching circuit to trip. A switch device is provided for applying a high-to-low voltage pulse to the source. A buffer and output reading device are provided for detecting whether or not the trip-point switching circuit has tripped. Circuit adjustment structure is provided for adjusting the trip point Voltage in increments until a threshold trip point is reached where the trip-point switching circuit does trip. A recording device is provided to record the threshold trip point whereby the dump charge through the transistor device can be determined.

According to the invention, another embodiment is provided for measuring a charge dump of a transistor device under test, the device under test having a source, a drain, and a gate. The method comprises the steps of: connecting a measuring circuit to the drain, the measuring circuit including a plurality of trip-point switching circuits, each of the switching circuits with their trip point set to an initial trip point voltage different from the other switching circuits; charging the drain to a supply voltage; applying a high-to-low voltage pulse to the source; detecting whether or not each of the trip-point switching circuits has tripped; recording the highest trip point just below when the switching circuit has tripped; recording the lowest trip point just above when the switching circuit has tripped; and estimating the threshold trip point between the highest trip point recorded and the lowest trip point recorded whereby the dump charge through the transistor device can be determined.

Further according to the invention, the method includes the steps of: determining a first charge at the drain at the threshold trip voltage; determining a second charge at the drain at the supply voltage; and subtracting the first charge from the second charge to determine the total dump charge from the drain to the source.

According to the invention, an alternative embodiment of a system for measuring the charge dump current of a transistor device on an SOI is disclosed. As set forth above, the device has a source, a drain, and a gate all formed on a substrate. The system comprises a measuring circuit with a plurality of trip-point switching circuits, each of the switching circuits with their trip point set to an initial trip point voltage different from the other switching circuits. Charging means are provided for charging the drain to a supply voltage. Switch means apply a high-to-low voltage pulse to the source. Circuit means detect whether or not the each of the trip-point switching circuits has tripped. Circuit means record the highest trip point just below when the switching circuit has tripped and the lowest trip point just above when the switching circuit has tripped. Device means estimate the threshold trip point between the highest trip point recorded and the lowest trip point recorded whereby the dump charge through the transistor device can be determined.

BRIEF DESCRIPTION OF THE DRAWINGS

These and further features of the present invention will be apparent with reference to the following description and drawings, wherein.

DETAILED DESCRIPTION OF THE INVENTION

Figure 1:
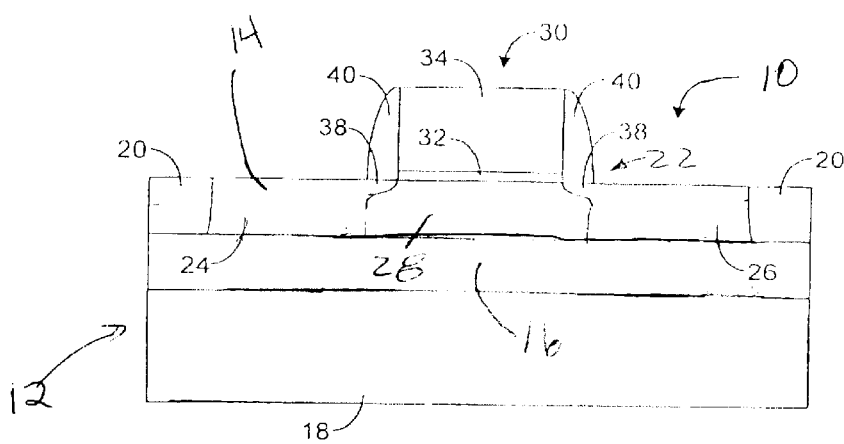
FIG. 1 is a cross-section of a typical semiconductor-on-insulator (SOI) device, according to the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring to FIG. 1, a semiconductor-on-insulator (SOI) device 10, also referred to herein as a transistor or as a partially-depleted metal oxide semiconductor field effect transistor (MOSFET), is fabricated on an SOI wafer 12 which has an active layer 14 disposed on a buried oxide (BOX) layer 16 which in turn is disposed on a conventional silicon substrate 18.

In the illustrated embodiment, the active layer 14 is made from silicon, which may or may not be initially doped to form N or P channel devices. However, as one skilled in the art will appreciate, other semiconductor materials may be used with similar results. The BOX layer 16 is disposed on another semiconductor material of the conventional silicon substrate 18. Within the active layer 14, shallow trench isolation (STI) regions 20 define the placement of active regions 22 used for the fabrication of active devices, such as the device 10 described more fully below.

The device 10 has a source 24 and a drain 26 with a body or channel 28 disposed therebetween. Disposed in top of the body 28 is a gate 30. The gate 30 includes a layer of gate oxide 32 and a polysilicon gate portion 34, or is formed from another gate stack formation as are known in the art.

After the gate 30 has been formed, the source 24 and drain 26 are doped to form extensions 38 using, for example, lightly doped drain (LDD) implants. Following extension 38 formation, sidewall spacers 40 are deposited adjacent to gate 30 and conventional doping is performed to complete the source 24 and the drain 26.

The measurement of an SOI transient on a single MOSFET 10, as shown in FIG. 1, is very difficult. That is, it is important to measure the bi-polar charge dump current, which leaks from the drain 26 to the source 24. According to the present invention, this measurement can be accomplished using the circuit shown in FIG. 2 and the method in FIG. 4 as discussed herein below.

Figure 2:
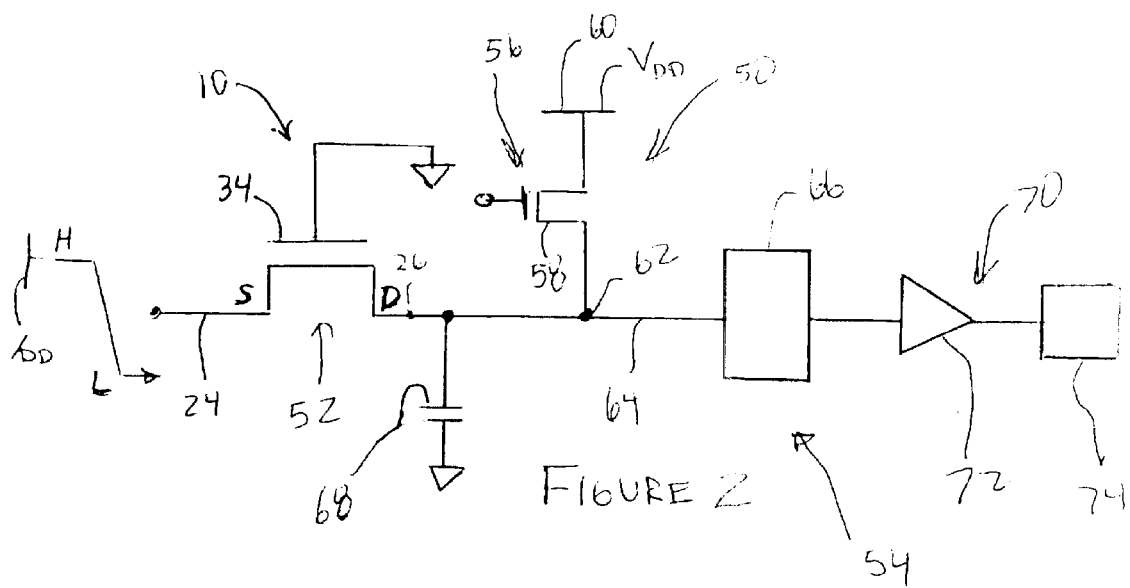
FIG. 2 is a block diagram of a circuit for measuring the charge dump of a single MOSFET of an SOI device, according to the present invention.

Referring to FIG. 2, there is shown the circuit 50 for measuring a transient of an N-ch MOSFET device under test (DUT) 52 (which for purposes of illustration is identical to the conventional device 10 shown in FIG. 1). It is also within the terms of the present invention to measure the transient (dump charge) of a P-ch MOSFET device by providing appropriate changes to the circuit 50.

The circuit 50 includes a measuring circuit 54 connected to the drain 26 of device 52(10). The measuring circuit 54 further includes a switchable connection 56, such as a P-ch MOSFET 58 having its source connected to a supply 60 voltage ($V_{DD}$) and its drain to a node 62. The MOSFET 58 is selectively turned on and off via a control signal CTRL applied to the gate of the MOSFET 58. The node 62 is located on a line 64 between the drain 26 and a trip-point switching circuit 66. The trip-point switching circuit 66 has an adjustable trip point resulting in a voltage output characteristic of the trip-point switching circuit 66 that follows the graph shown in FIG. 3 and that are further discussed herein below. The input to the trip-point switching circuit 66 is at node 62, and the output from the trip-point switching circuit 66 is to a buffer 72.

Generally speaking, the trip-point circuit 66 is designed to produce an output to the buffer 72 which transitions from a low state to a high state in the event the input voltage drops below the predefined trip point voltage. Such a circuit 66 may be constructed using a simple comparator circuit as will be appreciated. The trip point voltage may be adjusted using a simple voltage divider with selectable resistance for example.

Referring again to FIG. 2, the measuring circuit 54 includes a capacitor 68 connected at one end to line 64 between node 62 and the drain 26 and at the other end to ground. Further, the measuring circuit 54 includes means 70 for determining the output of the trip-point switching circuit 66. Means 70 includes an output reading device 74, such as a voltmeter or an LED, and the aforementioned buffer 72. The circuit 50 further includes a switch (not shown) for selectively generating a controlled high-to-low voltage pulse (e.g., $V_{DD}$ to ground) to source 24 of the DUT 52.

Figure 3:
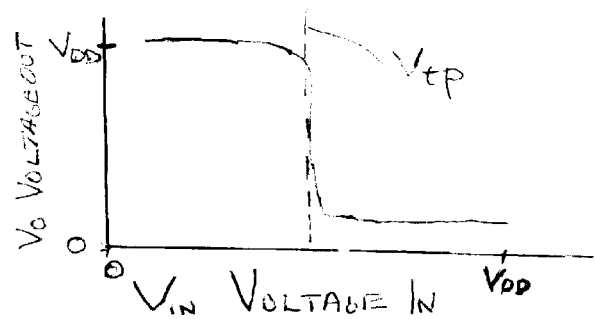
FIG. 3 is a graph of the switching circuit with adjustable trip point, according to the present invention.

Referring to FIG. 3, there is shown a graph of the voltage characteristics of the trip-point switching circuit 66. The voltage level at the circuit input (node 62) is $V_{IN}$ and the voltage level at the circuit output (buffer 70) is $V_O$. It can be seen that the trip-point switching circuit 66 is designed to maintain the output voltage $V_O$ in a low voltage state (e.g.,0V) whenever the voltage in $V_{IN}$ is above a trip-point voltage $V_{TP}$. In addition the trip-point switching circuit 66 is designed to switch the output voltage $V_O$ from the low state to a high voltage state (e.g., $V_{DD}$) whenever the input voltage $V_{IN}$ falls below the trip-point voltage $V_{TP}$. The input voltage level for the trip-point voltage $V_{TP}$ can be selectively adjusted to any of a plurality of values between zero and $V_{DD}$ volts using known techniques.

Figure 4:
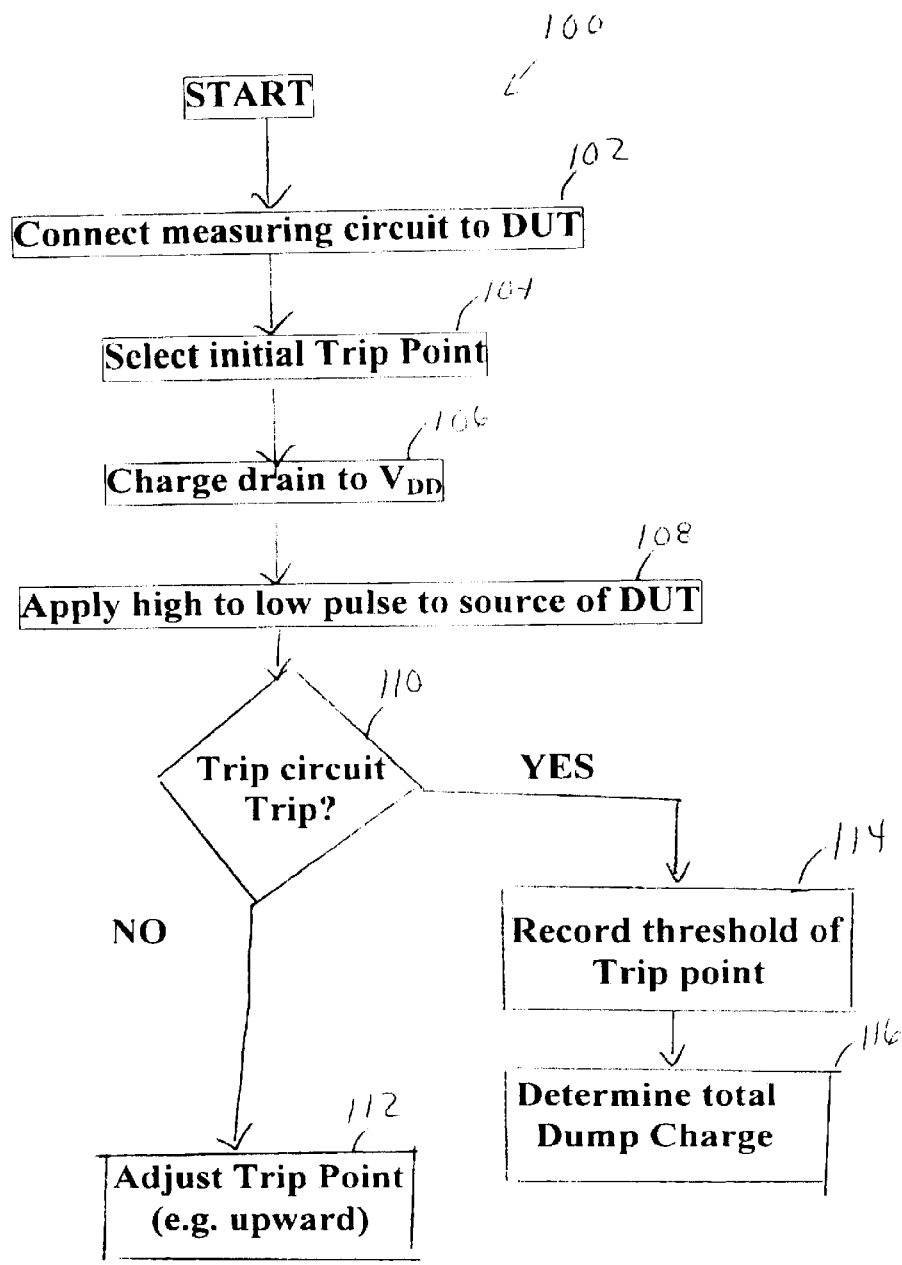
FIG. 4 is a flow chart illustrating a method using the circuit of FIG. 2 for measuring the charge dump of a single MOSFET of the SOI device, according to the present invention.

Referring to FIG. 4, a method 100 of measuring a transient of a MOFSET device, such as device 52 (compare device 10 shown in FIG. 1), is shown in flow-chart format. With additional reference to FIG. 2, the method begins in step 102 by attaching a measuring circuit 54 to the drain 26 of a device 10, hereinafter referred to as the device under test (DUT) 52. Also, a switch (not shown) selectively generates a controlled high-to-low voltage pulse (e.g., $V_{DD}$ to ground) to the source 24 of the DUT 52.

Next, in step 104, an initial trip-point voltage $V_{TP}$, e.g., low voltage, is set in the trip-point switching circuit 66. This initial trip-point voltage is selected as being significantly below any value of voltage that is expected to be at the drain when the low voltage pulse is applied to the source of the DUT 52.

Continuing in step 106 and with further reference to FIG. 2, the capacitor 68 is charged to the supply voltage $V_{DD}$ by the MOSFET 58. That is, the drain 26 is charged to $V_{DD}$ by turning MOSFET 58 on and then off after the capacitor 68 is fully charged to voltage $V_{DD}$. Next, in step 108, a controlled high to low voltage pulse is applied to the source 24 of the DUT 52.

Next, in step 110, either a first or second condition is detected (by output reading device 74). The first condition is where the trip-point switching circuit 66 outputs a high voltage out $V_O$ indicating that the voltage in $V_{IN}$ of the trip point switching circuit is below the initial trip point voltage $V_{TP}$ and therefore the switching circuit has tripped. Based on the selection of the initial trip point, one would not expect this condition to exist during the initial test of the DUT. The second condition is detected when the trip-point switching circuit 66 outputs a low voltage out $V_O$ indicating that the voltage in $V_{IN}$ of the trip-point switching circuit 66 is above the initial trip-point voltage $V_{TP}$ and therefore the switching circuit has not tripped. The second condition is expected during the initial test of the DUT when the initial trip point is set in the switching circuit 66.

In the case when the voltage $V_{IN}$ at the trip-point switching circuit 66 is above the initial trip-point voltage $V_{TP}$ and the switching circuit has not tripped, the trip-point voltage $V_{TP}$ is set upward by set increments in step 112 to a higher value. Then steps 106 through 110 are repeated until the value of $V_{TP}$ is reached when the trip-point switching circuit 66 trips, e.g., crosses the threshold between the first and second conditions to establish a threshold trip point voltage. Next in step 114, when the trip circuit has tripped, the trip threshold point voltage is recorded.

Continuing with step 116, the total transient dump charge through the DUT 52 can now be determined using known mathematical techniques and procedures for solving standard equations. Basically, once the threshold trip voltage is determined, a first charge ($Q_1$) at drain 26 can be determined. By subtracting first charge ($Q_1$) from a second charge ($Q_2$) at drain 26 when the low voltage pulse (e.g., $V_{DD}$) is applied to the source 24 of DUT 52, the total dump charge from the drain 26 to the source 24 of the DUT can be determined.

Alternatively, the initial trip-point voltage $V_{TP}$, can be selected as being significantly above any value of voltage that is expected to be at the drain when the low voltage pulse is applied to the source. In that case, when the voltage $V_{IN}$ at the trip-point switching circuit 66 is below the initial trip-point voltage $V_{TP}$ and the switching circuit has tripped, the trip-point voltage $V_{TP}$ is set downward by set increments to lower values until the trip-point switching circuit 66 does not trip and the threshold trip point voltage is established.

Figure 5:
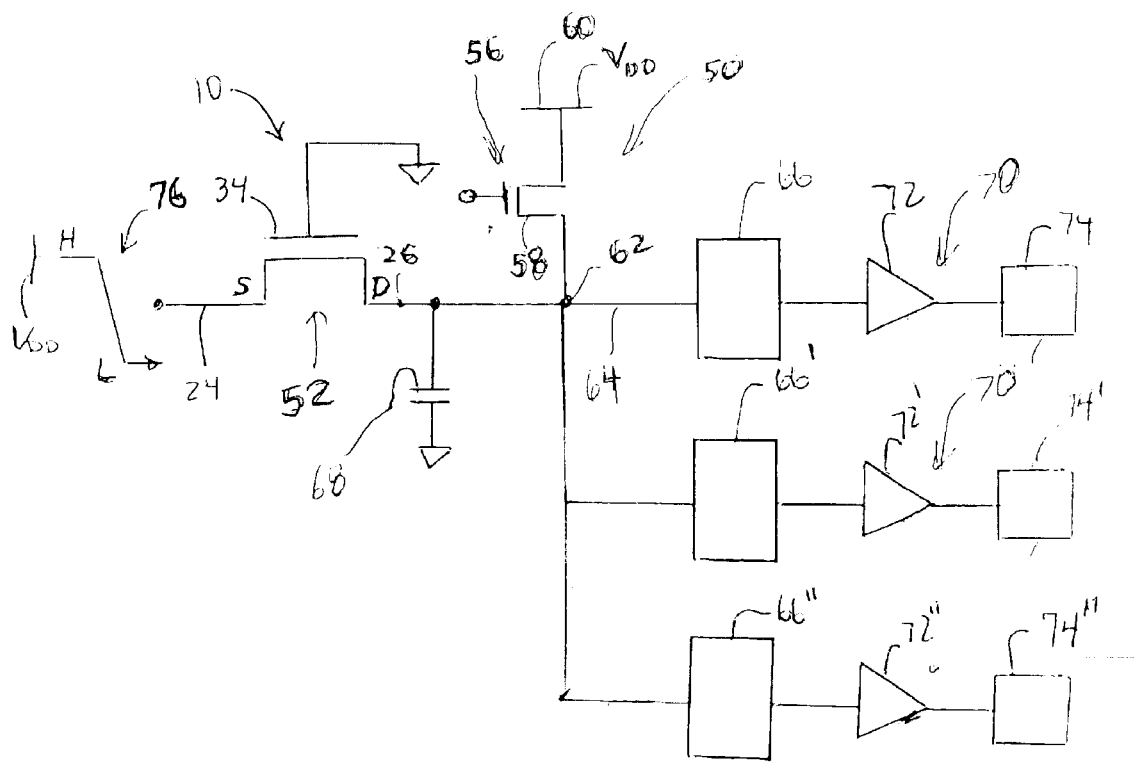
FIG. 5 is a block diagram of an alternative circuit for measuring the charge dump of a single MOSFET of an SOI device, according to the present invention.

In an alternative embodiment, as shown in FIG. 5, a plurality of trip-point switching circuits 66, 66', 66" are connected in parallel to node 62, and the output from the trip-point switching circuits 66, 66', 66" are connected to buffers 72, 72', 72", respectively, which in turn are connected to output reading devices 74, 74', 74", respectively. While three parallel, trip point switching circuits, buffers and output reading devices are illustrated, it is within the terms of the present invention to use any number of parallel connected components. Throughout the specification primed and double primed numbers identify circuit elements that are essentially identical to each other.

The trip-point switching circuits 66, 66',66" are set so that each of the adjustable trip points are set at different predefined voltage values, which are selected to cover the estimated range of either side of the expected trip point threshold point voltage. As discussed above, each of the trip-point circuits are designed to produce an output to their respective buffer which transitions from a low state to a high state in the event the input voltage drops below the predefined trip point voltage.

Figure 6:
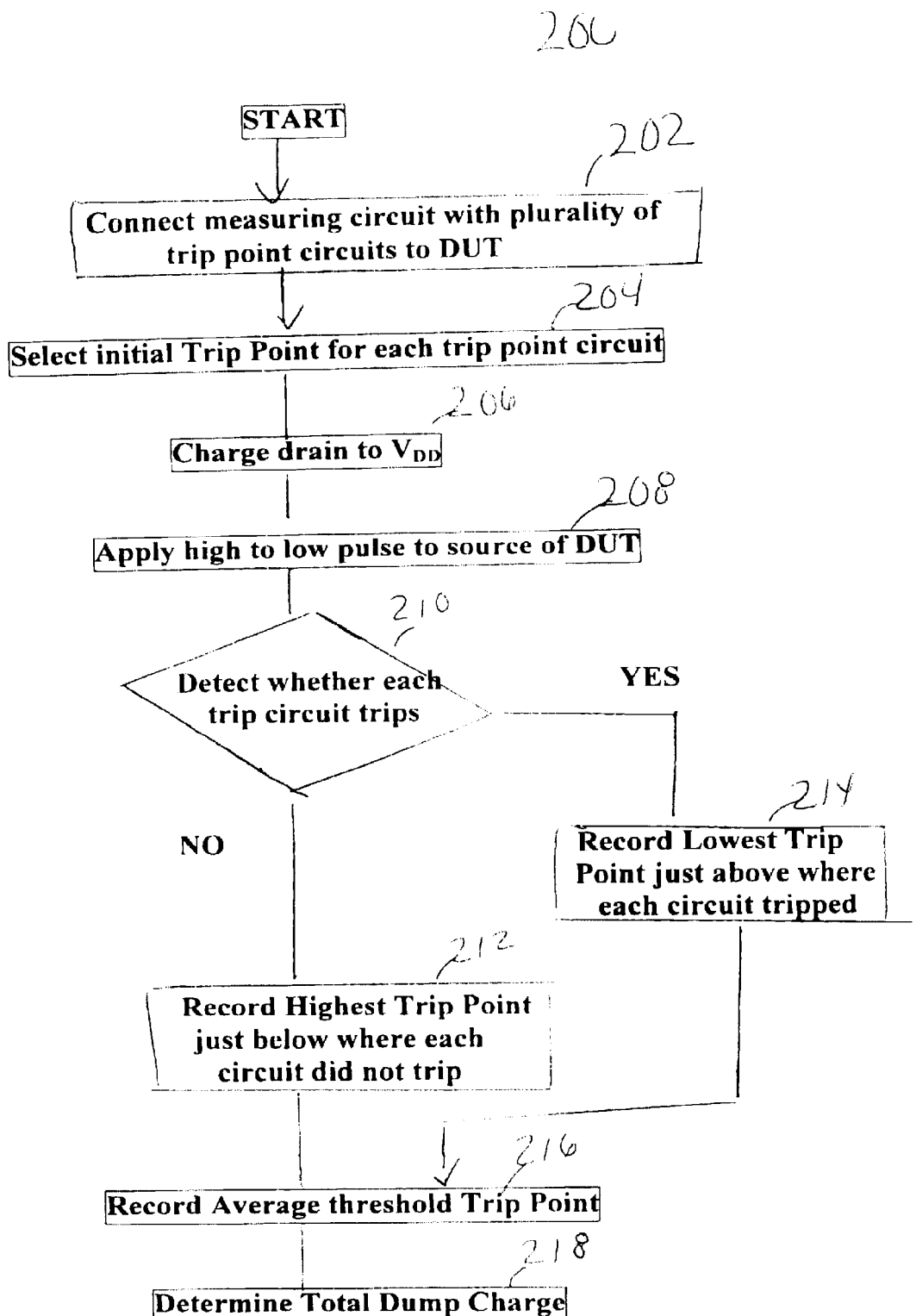
FIG. 6 is a flow chart illustrating a method using the circuit of FIG. 5 for measuring the charge dump of a single MOSFET of the SOI device, according to the present invention.

Referring to FIG. 6, an alternative method 200 of measuring a transient of a MOFSET device, such as device 52 (compare device 10 shown in FIG. 1), is shown in flow-chart format. With additional reference to FIG. 5, the method begins in step 202 by attaching a measuring circuit with the plurality of parallel connected trip point circuits 66,66',66" to the drain 26 of a device 10, hereinafter referred to as the device under test (DUT) 52.

Next, in step 204, different initial predetermined trip-point voltages $V_{TP}$, e.g. low voltage, are selected for each of the trip-point switching circuits 66, 66', 66".

Continuing in step 206 and with further reference to FIG. 5, the drain 26 is charged to the supply voltage $V_{DD}$ by the MOSFET 58. That is, the MOSFET 58 is turned on and then off after the capacitor 68 is fully charged to a supply voltage $V_{DD}$.

Next in step 208, a switch (not shown) selectively generates a controlled high-to-low voltage pulse (e.g., $V_{DD}$ to ground) to the source 24 of the DUT 52.

Then, in step 210, detect from each of the trip-point switching circuits 66, 66', 66" either a first condition (by output reading devices 74, 74', 74", respectively) wherein the trip-point switching circuit outputs a high voltage out $V_O$ indicating that the voltage in $V_{IN}$ of the trip point switching circuit is below the initial trip point voltage $V_{TP}$ and therefore the switching circuit has tripped or a second condition wherein the trip-point switching circuit outputs a low voltage out $V_O$ indicating that the voltage in $V_{IN}$ of the trip-point switching circuit is above the initial trip-point voltage $V_{TP}$ and therefore the specific switching circuit has not tripped.

In step 212, the highest trip point just below where the tripping circuits have not tripped is recorded. In step 214, the lowest trip point just above where the tripping circuits have tripped is recorded.

Then, in step 216, the average trip point voltage between the trip-point voltage $V_{TP}$ in the trip-point switching circuit that has not tripped and the trip-point voltage $V_{TP}$ in the trip-point switching circuit that has tripped is recorded. This is an effective means of automatically establishing where the voltage $V_{IN}$ crosses the threshold between the first and second conditions.

Next in step 218, the total transient dump charge through the DUT 52 can now be determined using known mathematical techniques and procedures for solving standard equations. Basically, once the average threshold trip voltage is determined, the first charge ($Q_1$) at drain 26 can be determined. By subtracting first charge ($Q_1$) from the second charge ($Q_2$) at drain 26 when the high to low voltage pulse is applied to the source 24 of DUT 52, the total dump charge from the drain 26 to the source 24 can be established.

Thus, several embodiments of a method and circuit have been disclosed to reliably estimate the total charge dump through a single MOSFET of an SOI device.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.) the terms (including a reference to a means used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed:

1. A method for measuring a charge dump of a transistor device under test, the device under test having a source, a drain, and a gate, the method comprising the steps of:
   a. connecting a measuring circuit to the drain, the measuring circuit having a trip-point switching circuit with its trip point set to an initial trip point voltage ($V_{TP}$) that should not cause the circuit to trip;
   b. charging the drain to a supply voltage;
   c. applying a high-to-low voltage pulse to the source;
   d. detecting whether or not the trip-point switching circuit has tripped;
   e. when the switching circuit has not tripped, adjusting the trip point Voltage in increments and repeating steps b, c and d until a threshold trip point voltage is reached where the trip-point switching circuit does trip; and
   f. recording the threshold trip point whereby the dump charge through the transistor device can be determined.

2. The method of claim 1 further including the step of:
   g. determining a first charge at the drain at the threshold trip voltage;
   h. determining a second charge at the drain at the supply voltage; and
   i. subtracting the first charge from the second charge to determine the total dump charge from the drain to the source.

3. The method of claim 1 further including the step of: connecting a buffer to an output of the trip-point switching circuit.

4. The method of claim 3 further including the step of: connecting an output reading device to the buffer.

5. The method of claim 1 wherein the step of charging drain to the supply voltage includes the step of charging a capacitor connected to the drain and to ground to the supply voltage.

6. The method of claim 5 further including the step of: charging the capacitor to the supply voltage with a switchable connection.

7. The method of claim 6 further including the step of: charging the capacitor by selectively turning on and off the switchable connection with a control signal CTRL.

8. A method for measuring a charge dump of a transistor device under test, the device under test having a source, a drain, and a gate, the method comprising the steps of:
   a. connecting a measuring circuit to the drain, the measuring circuit having a trip-point switching circuit with its trip point set to an initial trip point voltage ($V_{TP}$) that should cause the circuit to trip;
   b. charging the drain to a supply voltage;
   c. applying a high-to-low voltage pulse to the source;
   d. detecting whether or not the trip-point switching circuit has tripped;
   e. when the switching circuit has tripped, adjusting the trip point Voltage in increments and repeating steps b, c and d until a threshold trip point voltage is reached where the trip-point switching circuit does not trip; and
   f. recording the threshold trip point whereby the dump charge through the transistor device can be determined.

9. The method of claim 8 further including the step of:
   g. determining a first charge at the drain at the threshold trip voltage;
   h. determining a second charge at the drain at the supply voltage; and
   i. subtracting the first charge from the second charge to determine the total dump charge from the drain to the source.

10. A system for measuring the charge dump current of a transistor device on an SOI, the device having a source, a drain, and a gate all formed on a substrate, the system comprising:

a measuring circuit connected to the drain, the measuring circuit including a capacitor connected between the drain and ground, a switchable connection to apply a supply voltage to the capacitor, and a trip-point switching circuit connected to the drain;

circuit means are provided for setting the trip point of the trip-point switching circuit to an initial trip point voltage that should not cause the switching circuit to trip;

switch means for applying a high-to-low voltage pulse to the source; and recording means to record the threshold trip point voltage whereby the dump charge through the transistor device can be determined.

11. A method for measuring a charge dump of a transistor device under test, the device under test having a source, a drain, and a gate, the method comprising the steps of:
   a. connecting a measuring circuit to the drain, the measuring circuit including a plurality of trip-point switching circuits, each of the switching circuits with their trip point set to an initial trip point voltage different from the other switching circuits;
   b. charging the drain to a supply voltage;
   c. applying a high-to-low voltage pulse to the source;
   d. detecting whether or not the each of the trip-point switching circuits has tripped;
   e. recording the highest trip point just below where each switching circuit has tripped;
   f. recording the lowest trip point just above where each switching circuit has tripped;

g. record average threshold trip point between the highest trip point recorded and the lowest trip point recorded whereby the total dump charge through the transistor device can be determined.

12. The method of claim 11 further including the step of:

h. determining a first charge at the drain at the threshold trip voltage;

i. determining a second change at the drain at the supply voltage; and j. subtracting the first charge from the second charge to determine the total dump charge from the drain to the source.

13. The method of claim 11 further including the step of:

connecting a buffer to an output of each of the trip-point switching circuits.

14. The method of claim 11 further including the step of:

connecting an output reading device to each of the buffers.

15. The method of claim 11 wherein the step of charging the drain to the supply voltage includes the step of charging a capacitor connected to the drain and to ground.

16. The method of claim 15 further including the step of:

charging the capacitor to the supply voltage with a switchable connection.

17. The method of claim 16 further including the step of:

charging the capacitor by selectively turning on and off the switchable connection with a control signal CTRL.

18. A system for measuring the charge dump current of a transistor device on an SOI, the device having a source, a drain, and a gate all formed on a substrate, the system comprising:

the measuring circuit having a plurality of trip-point switching circuits, each of the switching circuits with their trip point set to an initial trip point voltage different from the other switching circuits;

means for charging the drain to a supply voltage;

means for applying a high-to-low voltage pulse to the source;

means for detecting whether or not each of the trip-point switching circuits has tripped;

means for recording the highest trip point just below where each of the switching circuits has tripped;

means for recording the lowest trip point just above where each of the switching circuits has tripped; and means for estimating the threshold trip point between the highest trip point recorded and the lowest trip point recorded whereby the dump charge through the transistor device can be determined.

* * * * *